(12) United States Patent
Masuoka

(10) Patent No.: US 7,256,462 B2
(45) Date of Patent: Aug. 14, 2007

(54) SEMICONDUCTOR DEVICE

(75) Inventor: Sadaaki Masuoka, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 154 days.

(21) Appl. No.: 11/219,783

(22) Filed: Sep. 7, 2005

(65) Prior Publication Data

US 2006/0060923 A1   Mar. 23, 2006

(30) Foreign Application Priority Data

Sep. 22, 2004   (JP) .............................. 2004-274537

(51) Int. Cl.
*H01L 27/092* (2006.01)
(52) U.S. Cl. .............................. 257/371; 257/E27.067; 438/214
(58) Field of Classification Search ................ 438/129, 438/214; 257/371, E27.067
See application file for complete search history.

(56) References Cited

U.S. PATENT DOCUMENTS 5,917,218 A * 6/1999 Choi et al. .................. 257/345
6,218,708 B1 * 4/2001 Burr ........................... 257/372
6,556,477 B2 * 4/2003 Hsu et al. ............... 365/185.08
6,664,608 B1 * 12/2003 Burr ........................... 257/549
2003/0013268 A1 * 1/2003 Rezvani et al. ............. 438/414
2005/0270850 A1 * 12/2005 Wang et al. ........... 365/185.28

FOREIGN PATENT DOCUMENTS

JP          2-283062         11/1990
JP          7-58289          3/1995

* cited by examiner

*Primary Examiner*—George Fourson
(74) *Attorney, Agent, or Firm*—Young & Thompson

(57) ABSTRACT

The present invention is to provide a high-quality semiconductor device allowing independent control of threshold voltage values of gate electrodes of transistors which reside in a plurality of one-conductivity-type regions and in a reverse-conductivity-type region. The semiconductor comprises a P-type Si substrate 109, a plurality of P-type wells 103a, 103b connected to each other via the bottom surface side of the P-type Si substrate 109, and an N-type well 101 provided so as to surround side portions of the plurality of P-type wells 103a, 103b. The semiconductor device also has NMOS transistors 107a, 107b provided on the P-type wells 103a, 103b, and PMOS transistors 105a, 105b, 105c provided on the N-type well 101. The semiconductor device still also has an N-type well 133 provided just under the N-type well 101 and connected therewith.

9 Claims, 7 Drawing Sheets

# SEMICONDUCTOR DEVICE

This application is based on Japanese patent application No. 2004-274537 the content of which is incorporated hereinto by reference.

BACKGROUND OF THE INVENTION

1. Field of the Invention

The present invention relates to a semiconductor device.

2. Related Art

For power saving of semiconductor devices such as processors, it is effective to vary voltage to be applied in a multi-step manner depending on process load burdened on the processors or the like. More specifically, it is effective to vary threshold voltage value of gate electrodes of transistors, by applying a voltage (back bias) to a region where the transistors are formed in the semiconductor devices, to thereby control voltage to be applied to the region where the transistors are formed.

In some cases, the semiconductor devices such as processors have a plurality of regions differing from each other in the functions thereof, and this raises a demand of controlling the threshold voltage value of the gate electrodes of the transistors for every region. Also in this case, it is effective to apply the voltage (back bias) to every specific region in the semiconductor devices so as to control the voltage to be applied to the regions having the transistors formed therein, to thereby vary the threshold voltage value of the gate electrodes of the transistors.

One known example of conventional semiconductors allowing application of the back bias is disclosed, for example, in Japanese Laid-Open Patent Publication No. 2-283062. According to this literature, a reverse-conductivity-type well region is provided to an one-conductivity-type semiconductor substrate, one-conductivity-type field effect transistors are formed in the reverse-conductivity-type well region, and reverse-conductivity-type field effect transistors are formed on the substrate. The literature also describes a configuration in which the reverse-conductivity-type well region is provided so as to close the circumferences of the surficial region of the substrate having the reverse-conductivity-type field effect transistor formed therein. In other words, an N-type well "ocean" is formed in a P-type substrate, and P-type region "islands" are formed in the N-type well "ocean".

Japanese Laid-Open Patent Publication No. 2-283062 also describes that this configuration makes it possible to dispense with well-to-well interconnections, and to achieve downsizing and higher density of CMOS ICs.

There is also known another conventional semiconductor device as described in Japanese Laid-Open Patent Publication No. 7-58289.

FIG. 7 is a sectional view showing a configuration of the semiconductor device. A semiconductor substrate 3 has two deep N-wells 5a and 5b formed therein by diffusing an N-type impurity to a large depth. The deep N-well 5a further has a P-well 6a and an N-well 7a formed therein, to thereby form a CMOS digital circuit (not shown). The N-well 7a is connected with a digital power source VDD via a high-concentration impurity diffused layer $N^+$. The deep N-well 5b further has a P well 6b and N-well 7b formed therein, to thereby form a CMOS analog circuit (not shown). The N-well 7b is connected with an analog power source VDD via a high-concentration impurity diffused layer $N^+$.

A P-well 4 is formed in a surficial region of the semiconductor substrate 3 between the digital circuit area and the analog circuit area, and two N-type, high-concentration impurity diffused layers $N^+$ and a single P-type high-concentration impurity diffused layer $P^+$ are formed in the P-well layer 4. One of two impurity-diffused regions $N^+$ is connected to the digital power source VDD, and the other is connected to the analog power source VDD. The impurity-diffused layer $P^+$ is connected to the ground power source (not shown) via a substrate dedicated grounding electrode, so that the P-well 4 serves as a grounding region.

Japanese Laid-Open Patent Publication No. 7-58289 describes that, this configuration is characterized by a triple well structure in which each of the regions respectively having the digital circuit and the analog circuit formed therein has the deep N-well, and that this structure electrically isolates both circuits from each other, to thereby suppress electrical interference between the digital circuit and the analog circuit.

The prior arts described in the above literatures, however, still have some room for improvement in the points below.

First, the semiconductor device described in Japanese Laid-Open Patent Publication No. 2-283062 tends to increase the resistivity of the region of the N-type well arranged between the P-type wells, because the region of the N-type well arranged between the P-type wells has an only a small width of the N-type region. This is highly causative of degradation of operation characteristics of PMOS transistors when the PMOS transistors are formed in the region of the N-well surrounded by the P-well.

Second, the semiconductor device described in Japanese Laid-Open Patent Publication No. 7-58289, having the plurality of N-well "islands" in the P-type "ocean" makes it difficult to control well potential of such plurality of N-type wells en bloc. This consequently makes it difficult to collectively control threshold voltage values of the gate electrodes of the PMOS transistors. Any possible efforts of collectively controlling the potential of the plurality of N-type wells will demand a plurality of additional metal interconnections laid between the plurality of N-wells, and will complicate the interconnection layout and increase the chip area.

The present invention was conceived after considering the above-described situations, and is to stably provide a high-quality semiconductor device allowing collective control of the threshold voltage values of gate electrodes of transistors which reside in one-conductivity-type regions and of transistors which reside in a reverse-conductivity-type region.

SUMMARY OF THE INVENTION

According to the present invention, there is provided a semiconductor device comprising: an one-conductivity-type semiconductor substrate; a plurality of one-conductivity-type first regions provided at the element formation surface side of the semiconductor substrate, said plurality of first regions electrically connected with each other via the bottom side of the semiconductor substrate; a reverse-conductivity-type second region seamlessly provided at the element formation surface side of the semiconductor substrate so as to surround the side portions of each of the plurality of first regions; a first transistor provided on each of not less than two said first regions; and a second transistor provided on the second region; wherein the bottom portion of the second region in the semiconductor substrate is provided at a level of depth, under the element formation surface as a reference level, deeper than the bottom portion of each of the first regions in the semiconductor substrate.

According to this configuration, the reverse-conductivity-type second region is seamlessly provided at the element formation surface side of the semiconductor substrate so as to surround the side portions of each of the plurality of first regions, and the plurality of one-conductivity-type first regions are electrically connected with each other via the bottom side of the semiconductor substrate. In other words, the bottom portions of the plurality of one-conductivity-type first regional "islands", as being surrounded by the reverse-conductivity-type second regional "ocean", are connected with each other via the bottom surface side of the semiconductor substrate. Potential of the first regions are therefore adjusted to the same potential via the bottom surface side of the semiconductor substrate. The second region provided as an "ocean" is set at the same potential as a whole. This consequently makes it possible to respectively control the threshold voltage values of gate electrodes of the transistors on the plurality of the one-conductivity-type regions and of the transistors on the reverse-conductivity-type region.

This configuration, having the reverse-conductivity-type second region having the bottom portion thereof set deeper than the bottom portions of the first regions, also makes it possible to lower the resistivity of the reverse-conductivity-type region, even when the width of the reverse-conductivity-type region is narrow. It is also made possible to lower the resistivity of the first regions because they are connected to the substrate of the same conductivity type, even when the plurality of the one-conductivity-type region "islands" are provided in the "oceanic" reverse-conductivity-type second region, in the element formation surface side of the semiconductor substrate.

This configuration therefore makes it possible to stably obtain a high-quality semiconductor device allowing independent control of threshold voltage values of the transistors on the plurality of one-conductivity-type regions and of the transistors on the reverse-conductivity-type region.

The present invention, having the plurality of the one-conductivity-type regions and the reverse-conductivity-type region specifically arranged therein, makes it possible to stably obtain a high-quality semiconductor device allowing independent control of threshold voltage values of the gates of the transistors on the plurality of one-conductivity-type regions and of the transistors on the reverse-conductivity-type region.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1A:
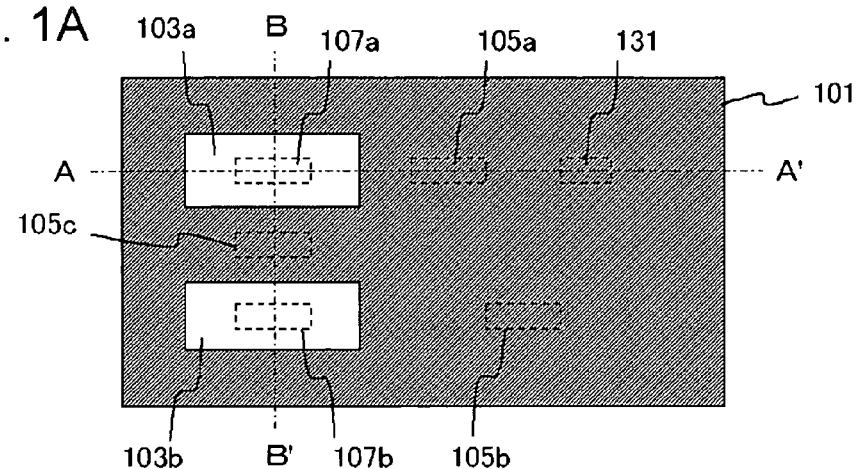
FIG. 1A is a horizontal sectional view and FIGS. 1B and 1C are vertical sectional views explaining a configuration of a semiconductor device of a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the present invention, the second region may be configured so as to have a concentration distribution of a reverse-conductivity-type impurity showing a plurality of peaks in the linear direction normal to the element formation surface.

This configuration makes it possible to stably fabricate the semiconductor device by ordinary fabrication processes such as two-step ion implantation of a reverse-conductivity-type impurity.

In the present invention, the second region may be configured as comprising a reverse-conductivity-type upper region provided at a first level of depth, under the element formation surface as a reference level, almost same as that of the first regions in the semiconductor substrate, so as to continuously surround side portions of each of the plurality of first regions; and a reverse-conductivity-type lower region provided at a second level of depth, under the element formation surface as a reference, deeper than the first regions in the semiconductor substrate, so as to contact with the upper region.

The second region in this configuration comprises the upper region and the lower region, and can therefore be fabricated by fabrication processes such as two-step ion implantation of a reverse-conductivity-type impurity. The second region as being configured by the upper region and the lower region makes it possible to independently design the size, geometry and so forth of the upper region and the lower region. For example, it is also made possible to make width of the lower region wider than a portion of the upper region placed between a pair of first regions. This is successful in reducing the overall resistivity of the second region.

In the present invention, the lower region may be provided on the bottom portion side of a portion of said upper region arranged between the plurality of first regions.

This configuration makes it possible to reduce the resistivity, because the portion of the upper region arranged between the plurality of first regions is electrically connected with the lower region provided on the bottom surface side.

In the present invention, the portion of the lower region may project out just under the first regions.

This configuration makes it possible to efficiently lower the overall resistivity of the second region, because the width of the lower region is wider than the width of the upper region.

In the present invention, the lower region may be provided on the bottom surface side of a portion of the upper region having the second transistor provided thereon.

This configuration makes it possible to lower the resistivity, because the portion of the upper region having the second transistor provided thereon is electrically connected to the lower region provided on the bottom surface side. This is successful in improving operation characteristic of the second transistor.

In the present invention, the one conductivity type may be P type, and the reverse conductivity type is N type.

This configuration makes it possible to stably fabricate the semiconductor device by common fabrication processes such as ion implantation of an N-type impurity into a P-type semiconductor substrate which is generally used as a substrate for semiconductor devices.

The following paragraphs will describe embodiments of the present invention referring to the attached drawings. It is to be noted that any common constituents will be given with the same reference numerals, allowing omission of explanations therefor on occasions.

First Embodiment

Figure 1B:
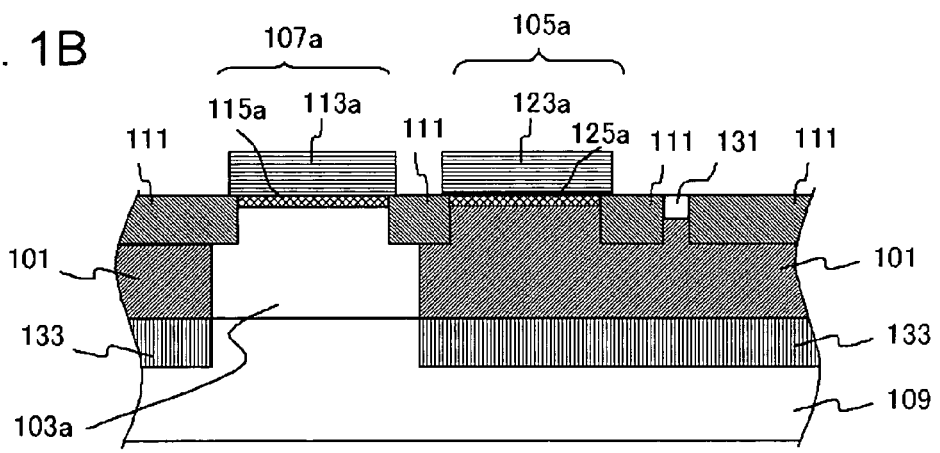
Figure 1C:
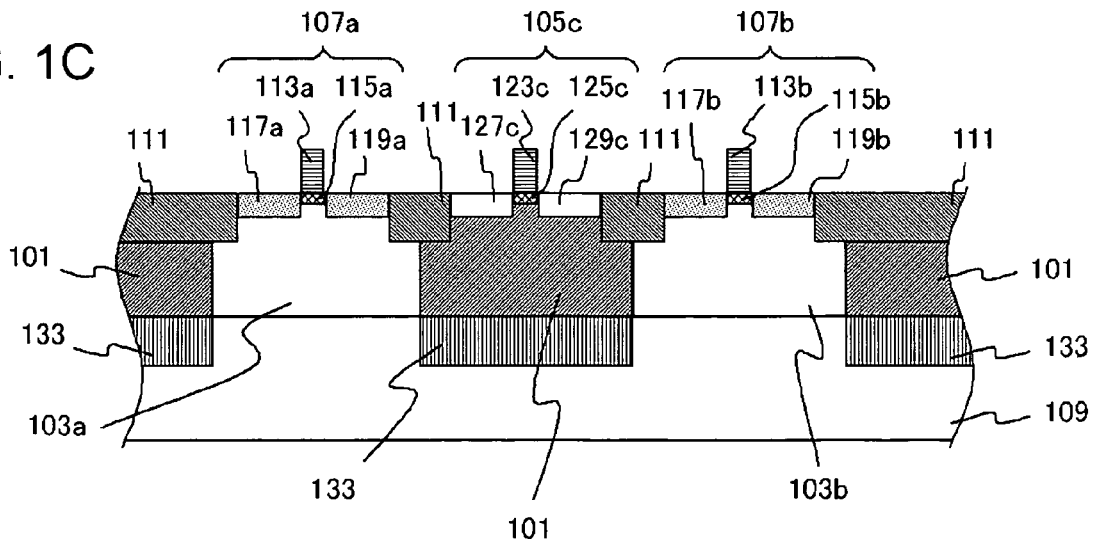

FIG. 1A is a horizontal sectional view and FIGS. 1B and 1C are vertical sectional views explaining a configuration of a semiconductor device of a first embodiment.

The semiconductor device of this embodiment comprises a P-type Si substrate 109 (one-conductivity-type semiconductor substrate). The semiconductor device comprises a plurality of P-type wells 103a, 103b (one-conductivity-type first regions) provided at the element formation surface side of the P-type Si substrate 109, and electrically connected with each other via the bottom surface side of the P-type Si substrate 109. The semiconductor device further comprises an N-type well 101 (an upper region of a reverse-conductivity-type second region) provided at the element formation surface side of the P-type Si substrate 109 so as to surround the side portions of each of the P-type wells 103a, 103b. That is, in one section horizontal to the element formation surface, the sections of the P-type wells 103a, 103b are arranged in the section of the N-type well 101. In other words, the N-type well 101 surrounding the P-type wells 103a, 103b is seamlessly provided.

The semiconductor device has NMOS transistors 107a, 107b (first transistors) provided on the P-type wells 103a, 103b. The semiconductor device also has PMOS transistors 105a, 105b, 105c (second transistors) provided on the N-type well 101.

The semiconductor device of this embodiment also has an N-type well 133 (the lower region of the reverse-conductivity-type second region) provided just under the N-type well 101 and electrically connected to the N-type well 101. That is, the overall depth of the N-type well comprising the N-type well 101 and the N-type well 133 is larger than the depth of the P-type wells 103a, 103b.

FIG. 1A is a horizontal sectional view of the semiconductor device of this embodiment, taken along a plane in parallel with the element formation surface.

In this embodiment, a plurality of "islands" of the P-type wells 103a, 103b are formed in an "ocean" of the N-type well 101, wherein the bottom portions of the plurality of P-type wells 103a, 103b are connected with each other via a P-type region at the bottom of the P-type Si substrate 109. In other words, the plurality of P-type wells 103a, 103b are surrounded by the N-type well 101 on their circumferential surface sides. On the other hand, the N-type well 101 is formed in a single "ocean" form.

The P-type well 103a has the NMOS transistor 107a formed thereon. The P-type well 103b has the NMOS transistor 107b formed thereon. The N-type well 101 has the PMOS transistors 105a, 105b, 105c formed thereon. The N-type well 101 has also an N-type well contact 131 formed therein.

FIG. 1B is a vertical sectional view of the semiconductor device of this embodiment, taken along line A-A'.

In the P-type Si substrate 109, the P-type well 103a is formed as being surrounded by the N-type well 101. In other words, the P-type wells 103a, 103b form "islands", and the N-type well 101 forms an "ocean". The P-type wells 103a, 103b and the N-type well 101 function as wells for logic region. The P-type wells 103a, 103b and the N-type well 101 have the NMOS transistors 107a, 107b and the PMOS transistors 105a, 105b, 105c respectively formed thereon as core transistors. That is, each well has, formed therein, an MOS transistor (MOSFET) of a reverse conductivity type with respect to the well.

The NMOS transistor 107a comprises a gate insulating film 115a and a gate electrode 113a. The PMOS transistor 105a comprises a gate insulating film 125a and a gate electrode 123a.

The gate insulating films 115a, 125a are formed by thermal oxidation. The gate insulating films 115a, 125a are, therefore, formed on the surface of the substrate. On the other hand, the gate electrodes 113a, 123a made of polysilicon are formed so as to partially overlap the element isolation regions 111 (STI).

Between every adjacent ones of the NMOS transistor 107a, the PMOS transistor 105a and the N-type well contact 131, there are respectively provided the element isolation region 111. Depths of the P-type wells 103a, 103b and the N-type well 101, under the element formation surface as a reference level, are equivalent. Just under the N-type well 101, the N-type well 133 is formed. That is, the N-type well 133 is formed at a deeper level than the bottom portions of the P-type wells 103a, 103b.

The P-type wells 103a, 103b and the N-type well 101 herein are provided at an almost equal level of depth, under the element formation surface as a reference level. Because the P-type well and the N-type well in general semiconductor devices are provided at an almost equal level, it is made possible to stably fabricate the P-type wells 103a, 103b and the N-type well 101, designed as being provided at an almost equal level of depth, in the element formation surface side of the P-type Si substrate 109 by well-known processes.

The N-type well 101 and the N-type well 133, illustrated as a two-layered vertical stack in the drawing, may be assumed as configuring a single N-type well in an integrated manner. This integrated N-type well (N-type well 101 and N-type well 133) has a concentration distribution of a reverse-conductivity-type impurity showing a plurality of peaks in the linear direction normal to said element formation surface. The bottom portion of the integrated N-type well (N-type well 101 and N-type well 133) is consequently formed at a level of depth deeper than the bottom portions of the P-type wells 103a, 103b.

FIG. 1C is a vertical sectional view of the semiconductor device of this embodiment, taken along line B-B'.

The PMOS transistor 105c is formed on the narrow N-type well 101 located between two P-type wells 103a, 103b having two NMOS transistors 107a, 107b respectively formed thereon. Threshold voltage values (controlled by potential of the N-type well 101) of the gate electrodes 123a, 123c (partially not shown) of all of the PMOS transistors 105a, 105b, 105c formed on the N-type well 101 are controlled by voltage applied to the N-type well 101 via a single point of N-type well contact 131 formed in the element formation surface of the P-type Si substrate 109.

Next paragraphs will describe operations of the semiconductor device of this embodiment.

In this embodiment, a power source (not shown) is externally provided to the semiconductor device, being set at a source voltage of 1.0 V. The power source is connected with a voltage adjustor (not shown). The power source is connected via the voltage adjustor to the P-type well contact (not shown) provided to the circumferential portion of the P-type Si substrate 109, and a desired voltage (Vpw) ranging from 0 to −2.0 V is applied to the P-type well contact. Because of the P-type conductivity of the P-type Si substrate 109, all potentials of the P-type wells 103a, 103b provided as a plurality of "island" regions in the core region in this case are adjusted to Vpw. This makes it possible to arbitrarily set the threshold voltage value of the gate electrodes 113a, 113b (partially not shown) of the NMOS transistors provided to the plurality of "islands" of P-type wells 103a, 103b.

On the other hand, the power source is connected via another voltage adjustor (not shown) to the N-type well contact 131, and a desired voltage (Vnw) ranging from 1.0 to 3.0 V is applied to the N-type well contact 131. The entire region of the N-type well 101 of the core region is seamless as a single "oceanic" arrangement, so that the potential anywhere in the N-type well 101 is adjusted to Vnw [W]. This makes it possible to arbitrarily set the threshold voltage value of the gate electrodes 123a, 123b (partially not shown) of the plurality of P-type transistors 105a, 105b, 105c provided to the N-well 101.

Next paragraphs will describe process steps of fabrication of the semiconductor device of this embodiment with reference to FIGS. 2A, 2B, 3A, 3B, 4A, 4B, 5A, and 5B.

Figure 2A:
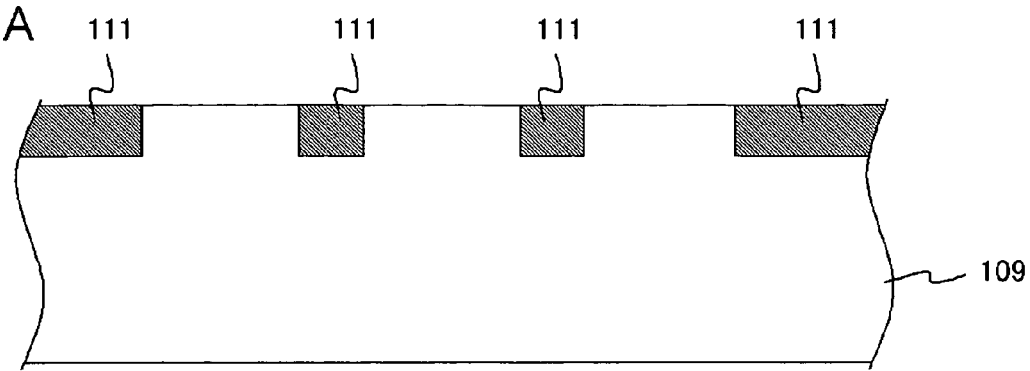
FIGS. 2A and 2B are sectional views showing process steps of fabricating the semiconductor device of the first embodiment.
Figure 2B:
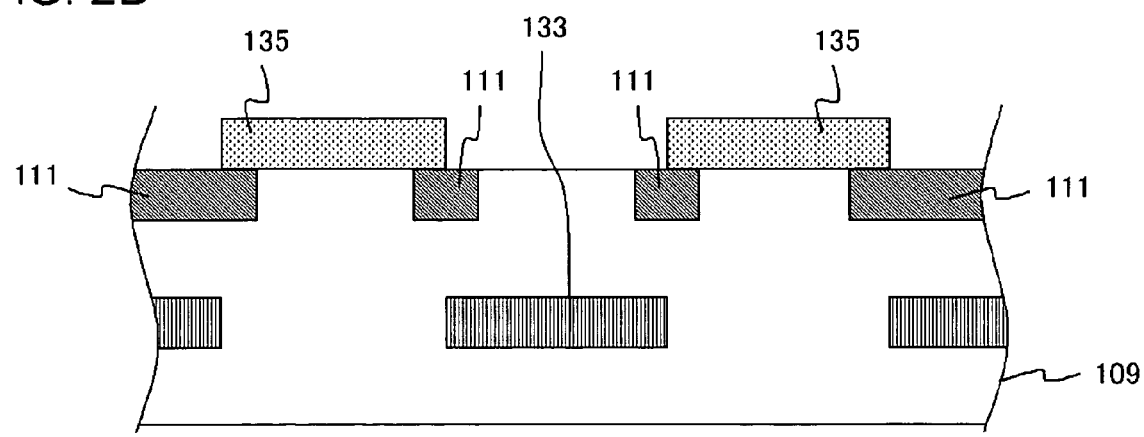

FIGS. 2A and 2B are sectional views explaining process steps of fabricating the semiconductor device of this embodiment. First, as shown in FIG. 2A, the element isolation regions 111 are formed on the element formation surface of the P-type Si substrate 109, by a known method. The element isolation regions 111 are formed by forming shallow trenches in predetermined regions of the element formation surface of the P-type Si substrate 109 using a mask (not shown), by filling the trenches with an insulating material, or by covering the inner surfaces of the trenches with an insulating film and then filling the trench with any other various materials, to thereby form a shallow trench isolation (STI) structure.

Next, as shown in FIG. 2B, using a photoresist mask 135, obtained by patterning a photoresist coated on the element formation surface of the P-type Si substrate 109, phosphorus is ion-implanted under conditions of, for example, 1 MeV, $2 \times 10^{13}$ cm$^{-2}$, to thereby form the "oceanic" N-type well 133 at a predetermined depth from the element formation surface. The N-type well 133 is formed at the lower portion of the region on which the PMOS transistor 105c and so forth of the core region, described later, will be formed.

Figure 3A:
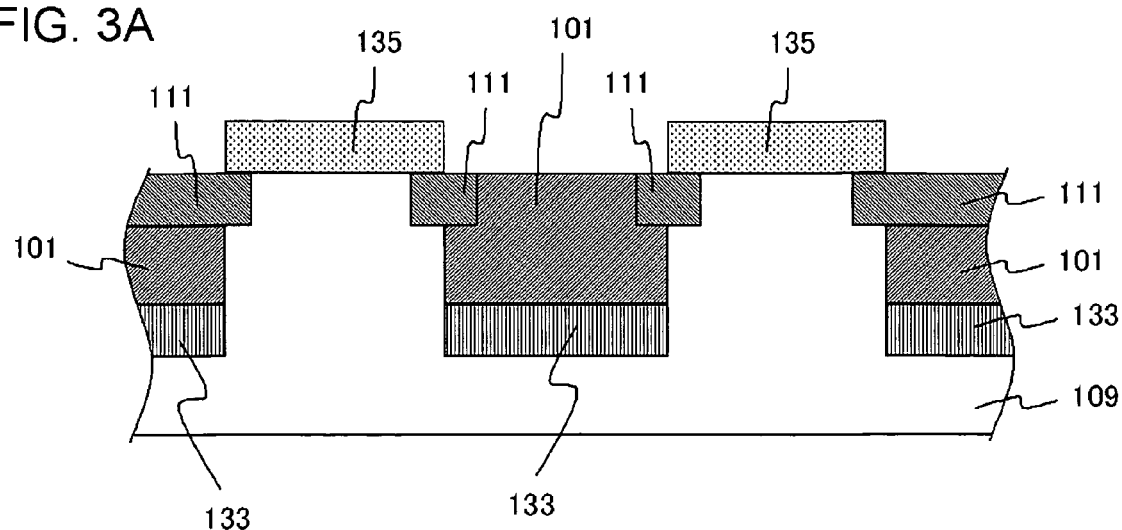
FIGS. 3A and 3B are sectional views showing process steps of fabricating the semiconductor device of the first embodiment.
Figure 3B:
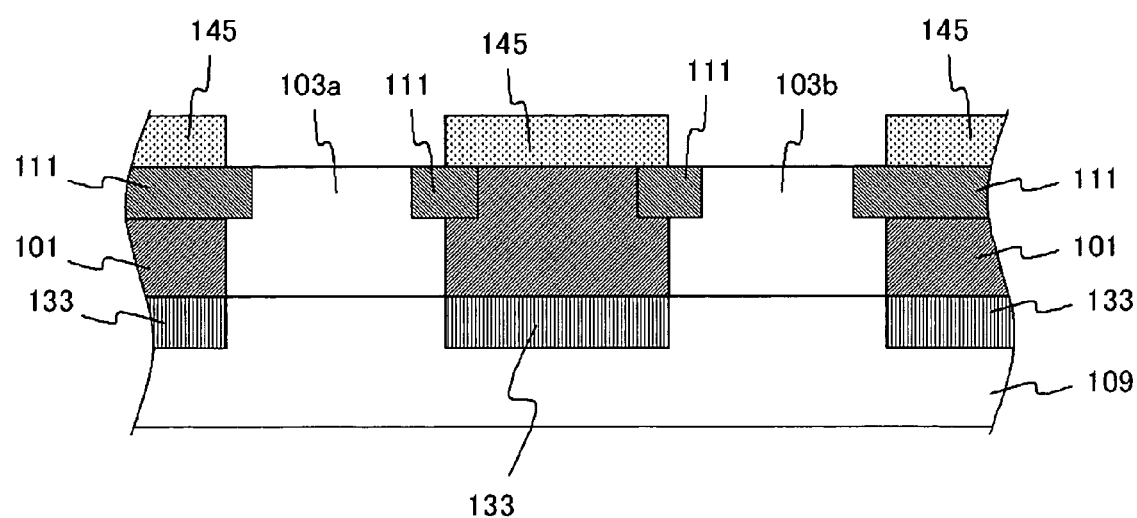

FIGS. 3A and 3B are sectional views explaining process steps of fabricating the semiconductor device of this embodiment. Next, as shown in FIG. 3A, using the photoresist mask 135, phosphorus is ion-implanted under conditions of, for example, 450 keV, $2 \times 10^{13}$ cm$^{-2}$, to thereby form the "oceanic" N-type well 101 on the N-type well 133. The N-type well 101 is formed not only as being under the region on which the PMOS transistor 105c and so forth of the core region, described later, will be formed, but also as being spread as an "ocean".

Next, as shown in FIG. 3B, the photoresist mask 135 is removed, and using a photoresist mask 145, formed by newly coating and patterning a photoresist on the element formation surface of the P-type Si substrate 109, boron is ion-implanted under conditions of, for example, 180 keV, $3 \times 10^{13}$ cm$^{-2}$, to thereby form the P-type wells 103a, 103b. The P-type wells 103a, 103b are formed under the region on which the NMOS transistors 107a, 107b and so forth of the core region, described later, will be formed.

Figure 4A:
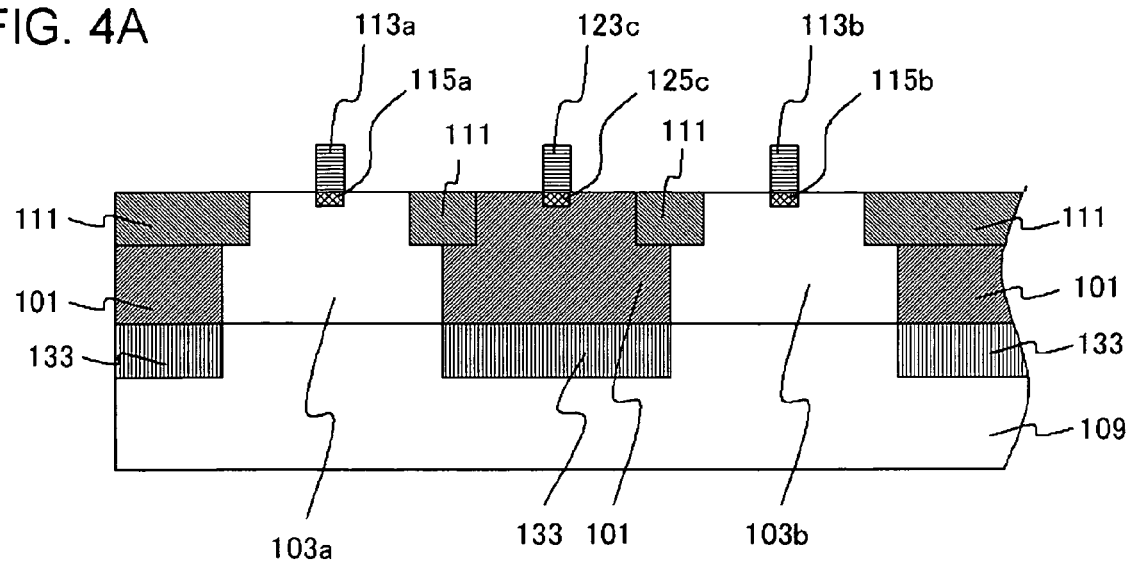
FIGS. 4A and 4B are sectional views showing process steps of fabricating the semiconductor device of the first embodiment.
Figure 4B:
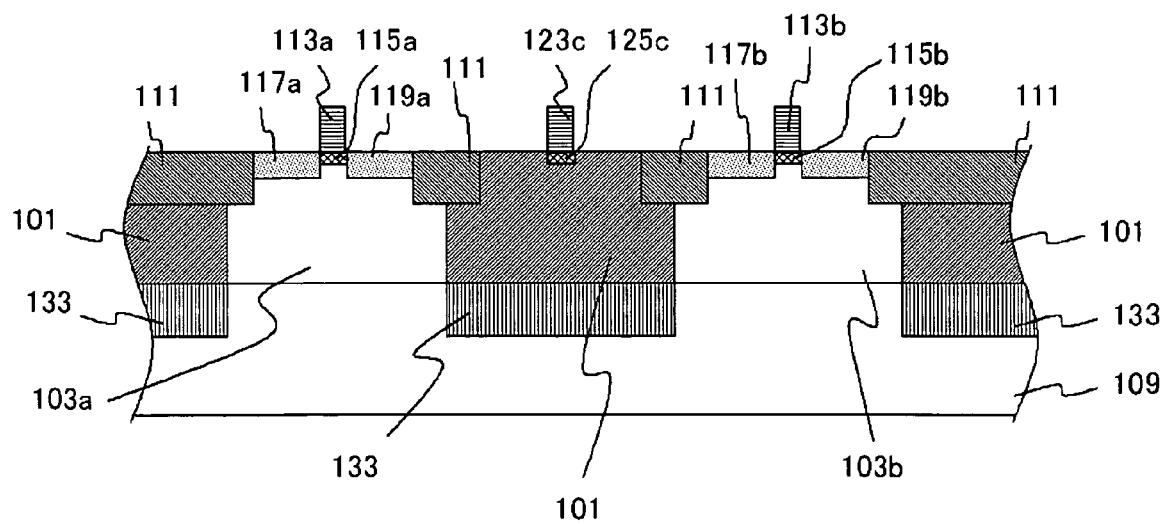

FIGS. 4A and 4B are sectional views explaining process steps of fabricating the semiconductor device of this embodiment. Next, as shown in FIG. 4A, the photoresist mask 145 is removed, and the gate insulating films 115a, 115b, 125c composed of a silicon oxide film, are formed by a known method on the element formation surface of the region on which the NMOS transistors 107a, 107b and the PMOS transistor 105c, described later, will be formed. On the gate insulating films 115a, 115b, 125c, formed are the gate electrodes 113a, 113b, 123c (sidewalls not shown) composed of a polysilicon film. More specifically, on the element formation surface of the P-type Si substrate 109, a stacked film of a silicon oxide film and a polysilicon film is formed, and the stacked film is then patterned by selective etching through a photoresist mask (not shown), to thereby form the gate insulating films 115a, 115b, 125c and the gate electrodes 113a, 113b, 123c.

Next, as shown in FIG. 4B, arsenic (As) is ion-implanted under conditions of, for example, 30 keV, $5 \times 10^{15}$ cm$^{-2}$, into the P-type wells 103a, 103b, while covering the region on which the PMOS transistor 105c is formed (region having the N-type well 101 formed therein) with a photoresist mask (not shown), to thereby form n$^+$ diffusion regions 117a, 119a, 117b, 119b which function as source and drain electrodes of the NMOS transistors 107a, 107b.

Figure 5A:
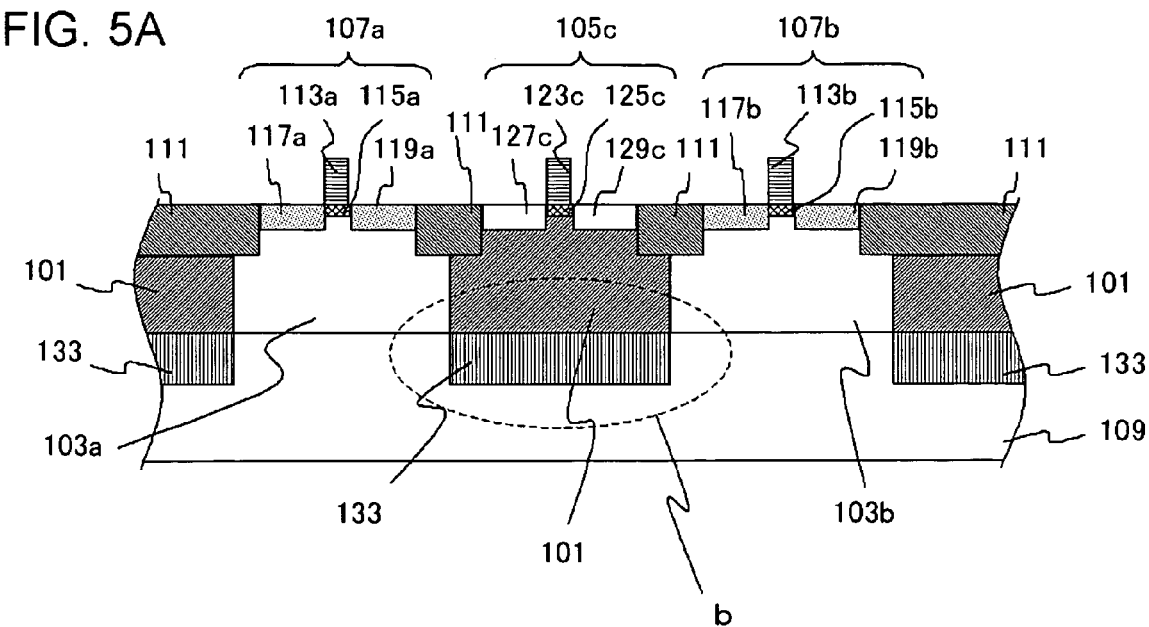
FIGS. 5A and 5B are sectional views showing process steps of fabricating the semiconductor device of the first embodiment.
Figure 5B:
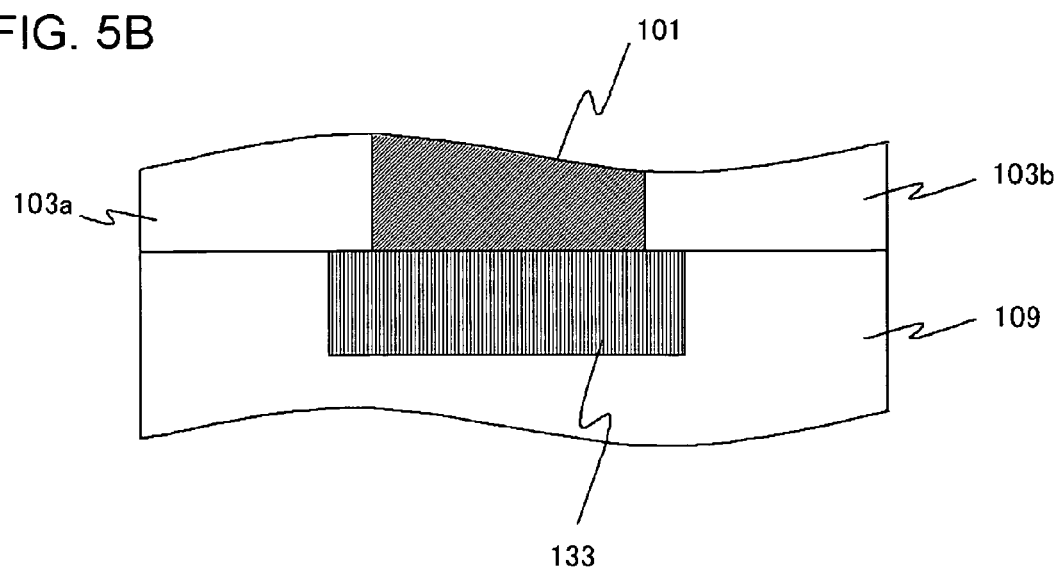

FIGS. 5A and 5B are sectional views explaining process steps of fabricating the semiconductor device of this embodiment. As shown in FIG. 5A, boron (B) is ion-implanted under conditions of, for example, 2 keV, $5 \times 10^5$ cm$^{-2}$ into the N-type well 101, while covering the region on which the NMOS transistors 107a, 107b are formed (region having the P-type wells 103a, 103b formed therein) with a photoresist mask (not shown), to thereby form p$^+$ diffusion regions 127c, 129c which function as source and drain electrodes of the PMOS transistor 105c.

FIG. 5B is an enlarged sectional view showing portion "b" of the semiconductor device shown in FIG. 5A. In the two-step ion implantation of an N-type impurity explained referring to FIG. 3A, phosphorus is ion-implanted under conditions of 1 MeV, $2 \times 10^{13}$ cm$^{-2}$ into the element formation surface of the P-type Si substrate 109 using a photoresist mask 135 obtained by coating and patterning a photoresist, to thereby form the "oceanic" N-type well 133 (lower region) at a predetermined level of depth from the element formation surface. Next, phosphorus is ion-implanted under conditions of 450 keV, $2 \times 10^{13}$ cm$^{-2}$ through the photoresist mask 135, to thereby form the "oceanic" N-type well 101 (upper region) on the N-type well 133.

N-type well 133, formed herein at a relatively deeper level under the element formation surface as a reference level, tends to cause spreading of the implanted phosphorus in the horizontal direction. In contrast, the N-type well 101, formed at a relatively shallower level under the element formation surface as a reference level, is less likely to cause such horizontal spreading of the implanted phosphorus. In view of lateral spreading in ion implantation, this is supposedly because a higher energy of ion implantation is more likely to cause the lateral spreading. For this reason, the horizontal dimension of the N-type well 133 tends to be larger than that of the N-type well 101. That is, in a sectional view taken along a reference plane connecting the P-type wells 103a, 103b and normal to the element formation surface, the width of the N-type well 133 is likely to be larger than the width of the region of the N-type well 101 located between the P-type wells 103a, 103b. In other words, a portion of the N-type well 133 is likely to project up to a position where it comes into contact with a portion of the bottom surfaces of the P-type wells 103a, 103b (i.e., the region just under the P-type wells 103a, 103b).

Operations and effects of this embodiment will now be explained below.

This embodiment makes it possible to collectively control the threshold voltage value of the gate electrodes of the plurality of NMOS transistors 107a, 107b formed on the P-type wells 103a, 103b. It is also made possible to collectively control the threshold voltage value of the gate electrode of the PMOS transistor 105c formed on the N-type well 101.

This embodiment also realizes downsizing of the semiconductor device. More specifically, this embodiment can dispense with interconnection between the P-type wells 103a, 103b, because the potential of the plurality of P-type well "islands" 103a, 103b disposed on a single P-type Si substrate 109 are connected with each other via the region in the bottom surface side of the P-type Si substrate 109. This successfully reduces the length of interconnection external to the P-type Si substrate 109, and realizes downsizing of the semiconductor device.

This embodiment also makes it possible to reduce the resistivity of the N-type well of the semiconductor device. More specifically, the PMOS transistor 105c formed on the region of the N-type well 101, located between P-type well 103a and P-type well 103b, and the N-type well contact 131 are connected with a region containing a narrow portion of the N-type well 101, so that absence of the N-type well 133 should result in a little higher resistivity therebetween. This embodiment is, however, successful in reducing the resistivity between the PMOS transistor 105c and the N-type well contact 131, by virtue of the N-type well 133 provided at a depth deeper than the P-type wells 103a, 103b.

Second Embodiment

Figure 6A:
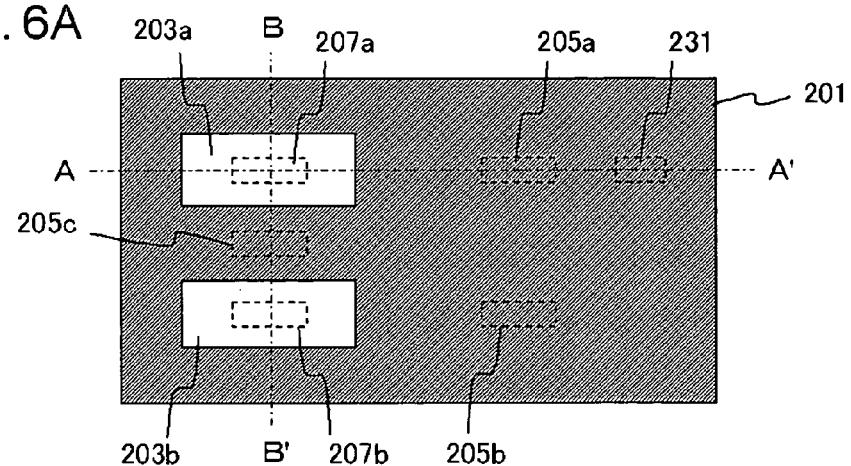
FIG. 6A is a horizontal sectional view and FIGS. 6B and 6C are vertical sectional views explaining a configuration of a semiconductor device of a second embodiment.
Figure 6B:
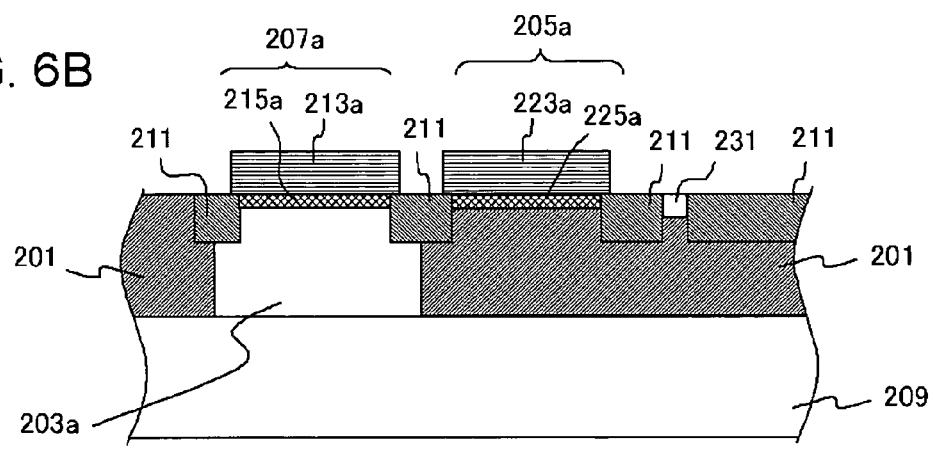
Figure 6C:
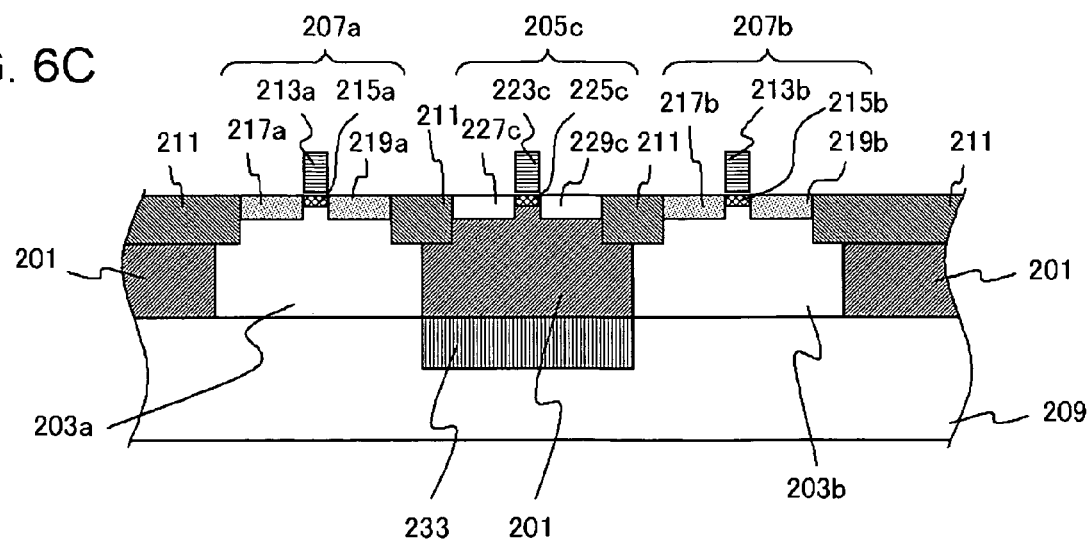
Figure 7:
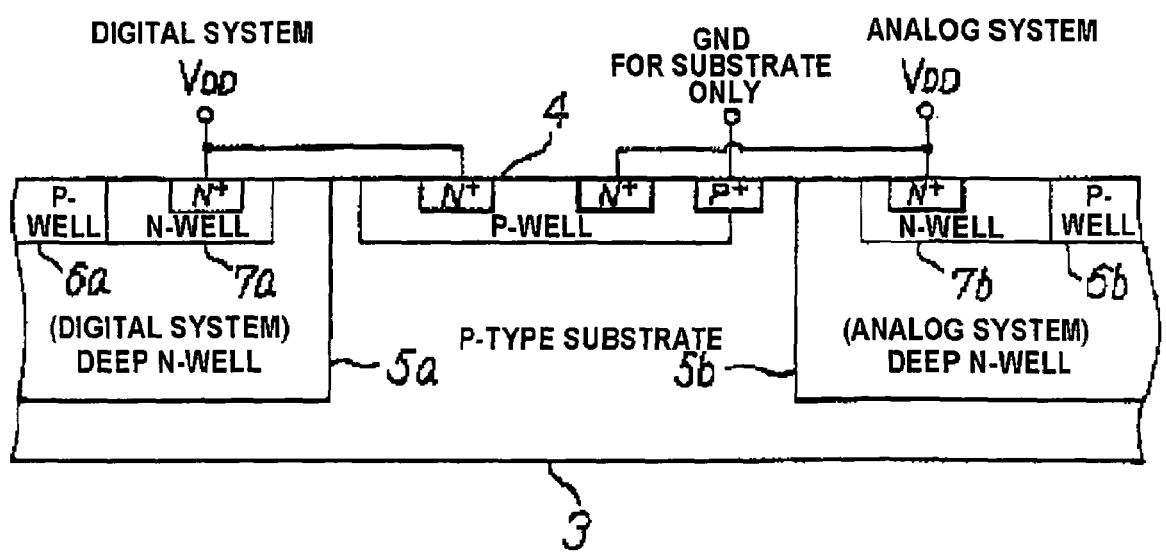
FIG. 7 is a vertical sectional view explaining a configuration of publicly-known conventional semiconductor device.

FIG. 6A is a horizontal sectional view and FIGS. 6B and 6C are vertical sectional views explaining a configuration of a semiconductor device of a second embodiment.

A configuration of the semiconductor device of this embodiment is basically same with that of the semiconductor of the first embodiment. The configuration of this embodiment differs from the configuration of the first embodiment in that a deeper N-type well 233 is formed under an "oceanic" shallow N-type well 201 but only just under the portion located between P-type wells 203a, 203b, and having a PMOS transistor 205c formed thereon.

FIG. 6A is a horizontal sectional view of the semiconductor device of this embodiment, taken along a plane in parallel with the element formation surface.

In this embodiment, a plurality of "islands" of the P-type wells 203a, 203b are formed in the "ocean" of the N-type well 201, wherein the bottom portions of the plurality of the P-type wells 203a, 203b are connected with each other via a P-type region at the bottom of a P-type Si substrate 209. In other words, the plurality of P-type wells 203a, 203b are surrounded by the N-type well 201 on their circumferential surface side. On the other hand, the N-type well 201 is formed in a single "ocean" form.

The P-type well 203a has an NMOS transistor 207a formed thereon. The P-type well 203b has an NMOS transistor 207b formed thereon. The N-type well 201 has PMOS transistors 205a, 205b, 205c formed thereon. The N-type well 201 has also an N-type well contact 231 formed therein.

FIG. 6B is a vertical sectional view of the semiconductor device of this embodiment, taken along line A-A'.

On the P-type Si substrate 209, the P-type well 203a is formed as being surrounded by the N-type well 201. In other words, the P-type wells 203a, 203b form "islands", and the N-type well 201 forms an "ocean". The P-type wells 203a, 203b and the N-type well 201 functions as wells for logic region. The P-type wells 203a, 203b and the N-type well 201 have the NMOS transistors 207a, 207b and the PMOS transistors 205a, 205b, 205c respectively formed thereon as core transistors. That is, each well has, formed thereon an MOS transistor (MOSFET) of a reverse conductivity type with respect to the well.

The NMOS transistor 207a comprises a gate insulating film 215a, a gate electrode 213a, an $N^+$ diffusion region 217a (source electrode), and an $N^+$ diffusion region 219a (drain electrode). The PMOS transistor 205a comprises a gate insulating film 225a, a gate electrode 223a, a $P^+$ diffusion region 227c (source electrode), and a $P^+$ diffusion region 229c (drain electrode).

The gate insulating films 215a, 225a are formed by thermal oxidation. The gate insulating films 215a, 225a are, therefore, formed on the surface of the substrate. On the other hand, the gate electrodes 213a, 223a made of polysilicon are formed so as to partially overlap element isolation regions 211 (STI).

Between every adjacent ones of the NMOS transistor 207a, the PMOS transistor 205a and the N-type well contact 231, there are respectively provided the element isolation region 211. Depths of the P-type wells 203a, 203b and the N-type well 201, under the element formation surface as a reference level, are equivalent.

FIG. 6C is a vertical sectional view of the semiconductor device of this embodiment, taken along line B-B'.

The PMOS transistor 205c is formed on the narrow N-type well 201 located between two P-type wells 203a, 203b having two NMOS transistors 207a, 207b respectively formed thereon. Threshold voltage values (controlled by potential of the N-type well 201) of the gate electrodes 213a, 213c (partially not shown) of all of the PMOS transistors 205a, 205b, 205c formed on the N-type well 201 are controlled by voltage applied to the N-type well 201 via a single point of N-type well contact 231 formed in the element formation surface of the P-type Si substrate 209.

In this embodiment, the N-type well 233 is formed under the N-type well 201 but only just under the portion arranged between the P-type wells 203a, 203b, out of the entire portion thereof, and having the PMOS transistor 205c formed thereon. That is, the N-type well 233 is formed at a level of depth deeper than the bottom portions of the P-type wells 203a, 203b. In addition, the N-type well 233 is not formed just under the portion of the N-type well 201 which is not located between the P-type wells 203a, 203b, out of the entire portion thereof.

Operations and effects of this embodiment will now be explained below.

The semiconductor device of this embodiment has operations and effects as described below, in addition to those of the semiconductor device of the first embodiment.

The semiconductor device of this embodiment is configured so as to increase the overall depth of the N-type well particularly in the portion highly causative of increase in the resistivity, so that it is made possible to efficiently lower the resistivity of the N-type well. More specifically, the deeper N-type well 233 is formed under the "oceanic" shallow N-type well 201 but only just under the portion located between the P-type wells 203*a*, 203*b*, and having the PMOS transistor 205*c* formed thereon, so that it is made possible to efficiently lower the resistivity of the whole N-type well (N-type well 201 and N-type well 233) at this location.

The present invention has been described in the above referring to the attached drawings, providing only exemplary cases of the present invention, and allowing adoption of any other various configurations.

It is apparent that the present invention is not limited to the above embodiments, that may be modified and changed without departing from the scope and spirit of the invention. For example, although the deeper N-type well 233 is formed under the N-type well 201 but only just under the portion having the PMOS transistor 205*c* formed thereon and located between P-type wells 203*a*, 203*b*, in the second embodiment, the deeper N-type well 233 may be formed under the portion of the N-type well 201 having the PMOS transistor 205*c* formed thereon, and not located between P-type wells 203*a*, 203*b*.

What is claimed is:

1. A semiconductor device comprising:
    an one-conductivity-type semiconductor substrate;
    a plurality of one-conductivity-type first regions provided at the element formation surface side of said semiconductor substrate, said plurality of first regions electrically connected with each other via the bottom side of said semiconductor substrate;
    a reverse-conductivity-type second region seamlessly provided at the element formation surface side of said semiconductor substrate so as to surround the side portions of each of said plurality of first regions;
    a first transistor provided on each of not less than two said first regions, and
    a second transistor provided on said second region;
    wherein the bottom portion of said second region in said semiconductor substrate is provided at a level of depth, under said element formation surface as a reference level, deeper than the bottom portion of each of said first regions in said semiconductor substrate.

2. The semiconductor device according to claim 1, wherein said second region has a concentration distribution of a reverse-conductivity-type impurity showing a plurality of peaks in the linear direction normal to said element formation surface.

3. The semiconductor device according to claim 1, wherein said second region comprises:
    a reverse-conductivity-type upper region provided at a first level of depth, under said element formation surface as a reference level, almost same as that of said first regions in said semiconductor substrate, so as to continuously surround side portions of each of said plurality of first regions; and
    a reverse-conductivity-type lower region provided at a second level of depth, under said element formation surface as a reference, deeper than said first regions in said semiconductor substrate, so as to contact with said upper region.

4. The semiconductor device according to claim 3, wherein said lower region is provided on the bottom portion side of a portion of said upper region arranged between said plurality of first regions.

5. The semiconductor device according to claim 3, wherein said lower region is provided on the bottom portion side of said upper region.

6. The semiconductor device according to claim 4, wherein a portion of said lower region projects out just under said first regions.

7. The semiconductor device according to claim 5, wherein a portion of said lower region projects out just under said first regions.

8. The semiconductor device according to claim 3, wherein said lower region is provided on the bottom surface side of a portion of said upper region having said second transistor provided thereon.

9. The semiconductor device according to claim 1, wherein said one conductivity type is P type, and said reverse conductivity type is N type.

* * * * *